US009087607B2

(12) United States Patent
Adams et al.

(10) Patent No.: US 9,087,607 B2
(45) Date of Patent: Jul. 21, 2015

(54) IMPLEMENTING SENSE AMPLIFIER FOR SENSING LOCAL WRITE DRIVER WITH BOOTSTRAP WRITE ASSIST FOR SRAM ARRAYS

(71) Applicant: International Business Machines Corporation, Armonk, NY (US)

(72) Inventors: Chad A. Adams, Byron, MN (US); Elizabeth L. Gerhard, Rochester, MN (US); Jeffrey M. Scherer, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/077,559

(22) Filed: Nov. 12, 2013

(65) Prior Publication Data
US 2015/0131368 A1 May 14, 2015

(51) Int. Cl.
*G11C 11/419* (2006.01)
*G06F 17/50* (2006.01)

(52) U.S. Cl.
CPC .......... *G11C 11/419* (2013.01); *G06F 17/5068* (2013.01)

(58) Field of Classification Search
CPC ............. G11C 11/4116; G11C 11/416; G11C 11/415; H01L 27/1025; H03K 3/388
USPC ............................................. 365/156, 189.14
See application file for complete search history.

(56) References Cited

U.S. PATENT DOCUMENTS

| 6,414,899 | B2 * | 7/2002 | Afghahi et al. .......... 365/230.06 |
|---|---|---|---|
| 8,008,659 | B2 | 8/2011 | Ikenaga et al. |
| 8,363,453 | B2 | 1/2013 | Arsovski et al. |
| 2005/0281108 | A1 | 12/2005 | Terzioglu et al. |
| 2008/0030260 | A1 * | 2/2008 | Anand et al. ................... 327/525 |
| 2009/0059702 | A1 * | 3/2009 | Sekiguchi et al. ............ 365/205 |
| 2009/0235171 | A1 | 9/2009 | Adams et al. |
| 2012/0185664 | A1 | 7/2012 | Anvar et al. |
| 2013/0028007 | A1 * | 1/2013 | Chen et al. .................... 365/154 |
| 2013/0064001 | A1 | 3/2013 | Terai |
| 2013/0111282 | A1 | 5/2013 | Clark et al. |
| 2013/0286717 | A1 | 10/2013 | Adams et al. |

FOREIGN PATENT DOCUMENTS

| EP | 1050820 A2 | 11/2000 |
|---|---|---|
| JP | 56090492 A | 7/1981 |
| JP | 02011159332 A1 | 8/2011 |

OTHER PUBLICATIONS

Verma, Naveen et al., "A 256 kb 65 nm 8T Subthreshold SRAM Employing Sense-Amplifier Redundancy", IEEE Journal of Solid-State Circuits, Vol. 43, No. 1, Jan. 2008.

* cited by examiner

*Primary Examiner* — James G Norman
(74) *Attorney, Agent, or Firm* — Joan Pennington

(57) ABSTRACT

A method and circuit for implementing sense amplifiers for sensing local write driver with bootstrap write assist for Static Random Access Memory (SRAM) arrays, and a design structure on which the subject circuit resides are provided. The circuit includes a sense amplifier used in both read and write operations with a write assist boost circuitry. The sense amplifier captures and amplifies write data at a selected SRAM cell column and drives the write data onto local bit lines. The write assist boost circuitry temporarily supplies an increased device voltage differential to the SRAM cell during write operations to significantly increase SRAM cell write ability.

18 Claims, 4 Drawing Sheets

IMPLEMENTING SENSE AMPLIFIER FOR SENSING LOCAL WRITE DRIVER WITH BOOTSTRAP WRITE ASSIST FOR SRAM ARRAYS

FIELD OF THE INVENTION

The present invention relates generally to the data processing field, and more particularly, relates to a method and circuit for implementing sense amplifiers for sensing local write driver with bootstrap write assist for Static Random Access Memory (SRAM) arrays, and a design structure on which the subject circuit resides.

DESCRIPTION OF THE RELATED ART

Device and technology scaling is becoming increasingly difficult in the semiconductor industry. For SRAM design in general there are several key design components that are struggling.

A first component is designing an SRAM cell that is stable enough to hold its state while still being fast enough to write at higher frequencies. Another component is that the resistance and capacitance of the wires are not scaling in proportion to the devices. This is especially problematic in larger arrays with longer wires because device drivers must be sized to drive wires that have not scaled with the technology node.

The increase in device sizes decreases the power savings that the design sees by going to a smaller or newer technology. The final component is that the device leakage is also not scaling in proportion to the devices. The increased leakage from the devices also reduces the overall power savings that a design would see in a new technology.

One area where these design issues can be addressed is in the generation of the write data lines feeding the SRAM cell. In larger SRAM arrays the overall structure of the array is broken into banks with the same data lines feeding each bank. These wires tend to be very long and require large devices to drive them. The larger devices use more power to drive the data lines to full rail and also tend to have more device leakage when they are in the off state.

Another issue often associated with the write data lines is that the delay and slew of those signals directly impacts the write ability of the SRAM cell. This is further compounded by the fact that smaller technologies tend to skew the devices of the SRAM cell themselves such that the cell is more stable. By skewing the SRAM cell such that it is more stable the cell inherently becomes more difficult to write.

US Patent publication US 2009/0235171 A1 to Adams et al., published Sep. 17, 2009 and assigned to the present assignee discloses apparatus for implementing a write assist for a memory array that includes a common discharge node configured to provide a discharge path for precharged write data lines and bit lines selected during a write operation of the memory array; negative boost circuitry configured to introduce a voltage lower than a nominal logic low supply voltage onto the common discharge node following the discharge of the common discharge node, write data lines and bit lines; and a clamping device coupled to the common discharge node, the clamping device configured to limit the magnitude of negative voltage applied to common discharge node by the negative boost circuitry so as to prevent activation of non-selected bit switches.

While the above identified U.S. patent publication provides improvements over prior art arrangements, a need exists for a circuit having an efficient and effective sense amplifier mechanism for sensing local write driver with bootstrap write assist for SRAM arrays. It is desirable to provide such a sense amplifier mechanism to enable the use of a small device dimension SRAM cell, saving active and static power, increasing efficiency, and achieving SRAM cell stability, write-ability, and performance.

SUMMARY OF THE INVENTION

Principal aspects of the present invention are to provide a method and circuit for implementing sense amplifiers for sensing local write driver with bootstrap write assist for Static Random Access Memory (SRAM) arrays, and a design structure on which the subject circuit resides. Other important aspects of the present invention are to provide such method, circuit and design structure substantially without negative effects and that overcome many of the disadvantages of prior art arrangements.

In brief, a method and circuit for implementing sense amplifiers for sensing local write driver with bootstrap write assist for Static Random Access Memory (SRAM) arrays, and a design structure on which the subject circuit resides are provided. The circuit includes a sense amplifier used in both read and write operations with a write assist boost circuitry. The sense amplifier captures and amplifies write data at a selected SRAM cell column and drives the write data onto local bit lines.

In accordance with features of the invention, by using the sense amplifier in both read and write operations, rather than in only read operations, device area and total device leakage are both reduced with fewer total devices.

In accordance with features of the invention, the circuit includes limited swing drivers used together with sensing the write data using the sense amplifier rather than driving global data across high parasitic metal wires to full voltage rail, enabling significant active and static power saving.

In accordance with features of the invention, using the sense amplifier to drive the write data onto the local bit lines also enables the use of a full transmission gate (both PFET and NFET) data driving for write operations and eliminates the necessity of using cross-coupled PFETs in the bit-switch to pull up the logic high data.

In accordance with features of the invention, the correct use of the write assist boost circuit has been shown to significantly increase SRAM cell write ability.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In the following detailed description of embodiments of the invention, reference is made to the accompanying drawings, which illustrate example embodiments by which the invention may be practiced. It is to be understood that other embodiments may be utilized and structural changes may be made without departing from the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In accordance with features of the invention, a method and circuit for implementing sense amplifiers for sensing local write driver with bootstrap write assist for Static Random Access Memory (SRAM) arrays, and a design structure on which the subject circuit resides are provided.

Figure 1:
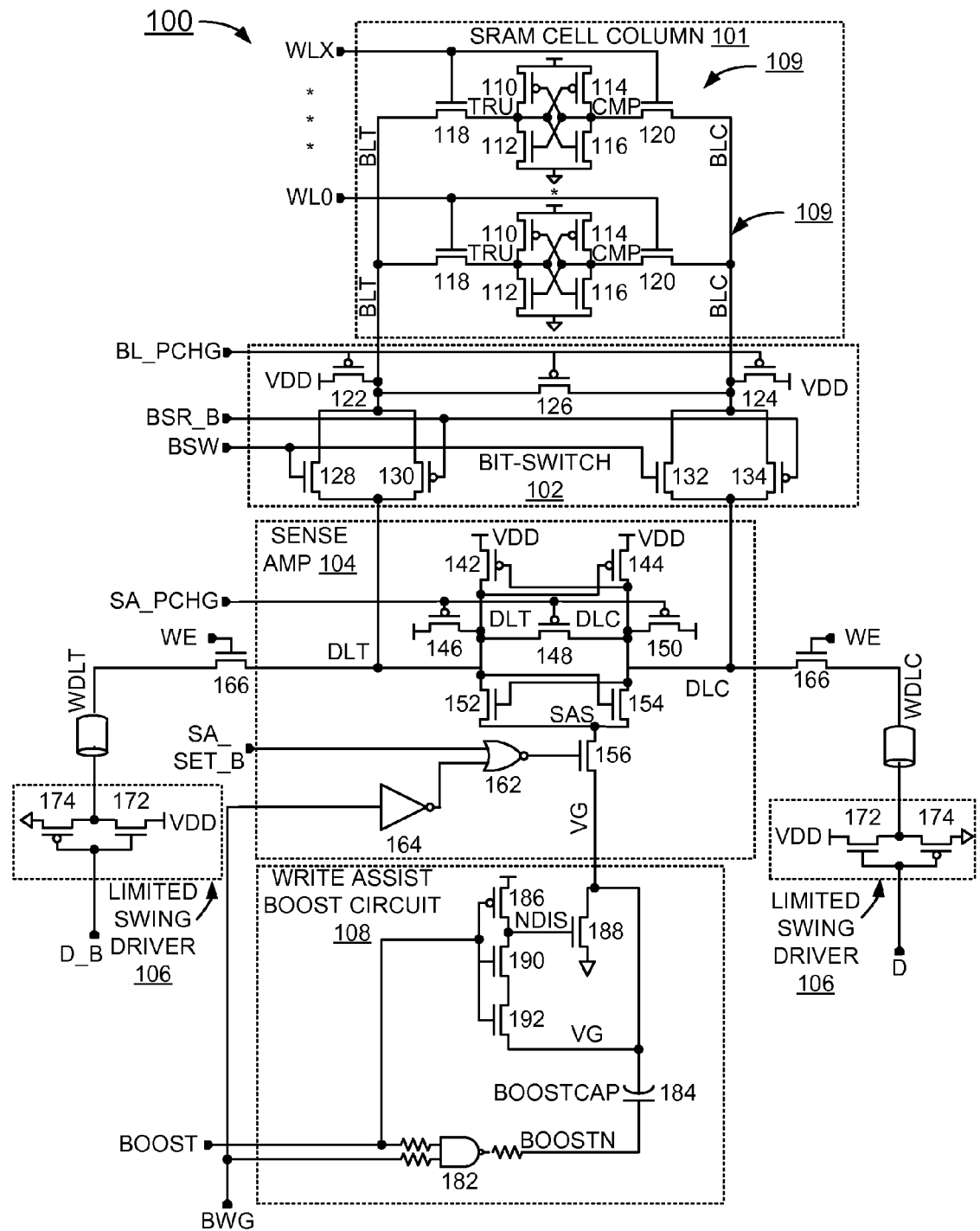
FIG. 1 schematically illustrates an example circuit for implementing sense amplifiers for sensing local write driver with bootstrap write assist for Static Random Access Memory (SRAM) arrays in accordance with a preferred embodiment.

Having reference now to the drawings, FIG. 1 schematically illustrates an example circuit for implementing sense amplifiers for sensing local write driver with bootstrap write assist for Static Random Access Memory (SRAM) arrays generally designated by the reference character 100 in accordance with a preferred embodiment.

SRAM circuit 100 includes a SRAM cell column generally designated by the reference character 101, a bit-switch generally designated by the reference character 102, a sense amplifier generally designated by the reference character 104, a pair of limited swing drivers generally designated by the reference character 106, and a write assist boost circuit generally designated by the reference character 108.

In accordance with features of the invention, SRAM circuit 100 uses the sense amplifier 104 in both read and write operations, rather than in only read operations, so that device area and total device leakage advantageously are both reduced with fewer total devices. Additionally significant active and static power advantageously is saved by using limited swing drivers 106 and sensing the global write data using the sense amplifier 104 rather than driving global data across high parasitic metal wires to full rail. Using the sense amplifier circuit 104 to drive the write data onto the local bit lines also creates the opportunity to enable a full transmission gate (both PFET and NFET) data driving for write operations and eliminates the necessity of using cross-coupled PFETs in the bit-switch 102 to pull up the logic high data. Also, the write assist boost circuit 108 significantly increases SRAM cell write ability.

SRAM cell column 101 includes a plurality of SRAM cells 109; each SRAM cell 109 includes four transistors 110, 112, 114, and 116 configured as a cross-coupled latch for storing data. A pair of transistors 118, 120 is used to obtain access to the memory cell. A respective wordline input WL0-WLX provides a gate input to the N-channel field effect transistor (NFETs) 118, 120 of each respective plurality of SRAM cell 109. A particular wordline input WL0-WLX is activated, turning on respective NFETs 118, 120 to perform a read or write operation.

The bit-switch 102 of the preferred embodiment is coupled to true and complement bit lines BLT, BLC of the SRAM cell column 101 and data true and complement lines DLT, DLC of sense amplifier 104. The bit-switch 102 includes a plurality of bit line precharge P-channel field effect transistors (PFETs) 122, 124 The pair of precharge PFETs 122, 124 is coupled between a voltage supply rail VDD and the respective true and complement bit line BLT, BLC. The precharge and equalization PFET 126 is coupled between the true and complement bit lines BLT, BLC. The precharge signal BL_PCHG is applied to a gate of each precharge and equalization PFETs 122, 124, 126 for precharging the true and complement bit lines BLT, BLC. Using the sense amplifier 104 to amplify and drive write data onto the local bit lines BLT, BLC enables a full transmission gate data driving for write operations in the bit-switch circuit 102. The bit-switch 102 includes a respective NFET 128 and PFET 130, and NFET 132 and PFET 134 respectively coupled to true and complement bit lines BLT, BLC of the SRAM cell column 101 and respectively coupled to the write data node pair DLT, DLC of the sense amplifier 104. An inverted bit switch BSR_B signal is applied to the gate of PFETs 130, 134, and a bit switch BSW signal is applied to the gate of NFETs 128, 132. In the SRAM circuit 100 of the preferred embodiment, the need for using conventional cross-coupled PFETs in the bit-switch 102 to pull up the logic high data is eliminated.

In FIG. 1, SRAM circuit 100 is shown in simplified form sufficient for understanding the present invention. For example, a complete read path is omitted for simplicity. In a complete circuit a data out driver would be added to one or both of the internal nodes DLT, DLC.

The sense amplifier 104 of the preferred embodiment enables read and write functions. The sense amplifier 104 is used to capture, amplify, and drive the global write data, providing write data true and complement DLT, DLC to the bit-switch circuit 102 in accordance with the preferred embodiment.

The sense amplifier 104 includes a plurality of P-channel field effect transistors (PFETs) 142, 144, 146, 148, 150 and a plurality of N-channel field effect transistors (NFETs) 152, 154, 156, as shown. PFETs 142, 144 and NFETs 152, 154 are cross-coupled devices connected between internal nodes DLT, DLC. PFETs 146, 148, 150 are precharge and equalization devices connected to and between internal nodes DLT, DLC having a precharge signal SA_PCHG applied to a gate. NFET 156 is connected between node SAS connection of NFETs 152, 154 and virtual ground node VG from the write assist boost circuit 108. A 2 input NOR gate 162 having a SA_SET_B INPUT and an inverted BWG output of inverter 164 provides a delay stage input applied as a gate input to NFET 156 for write and read operations.

Figure 2:
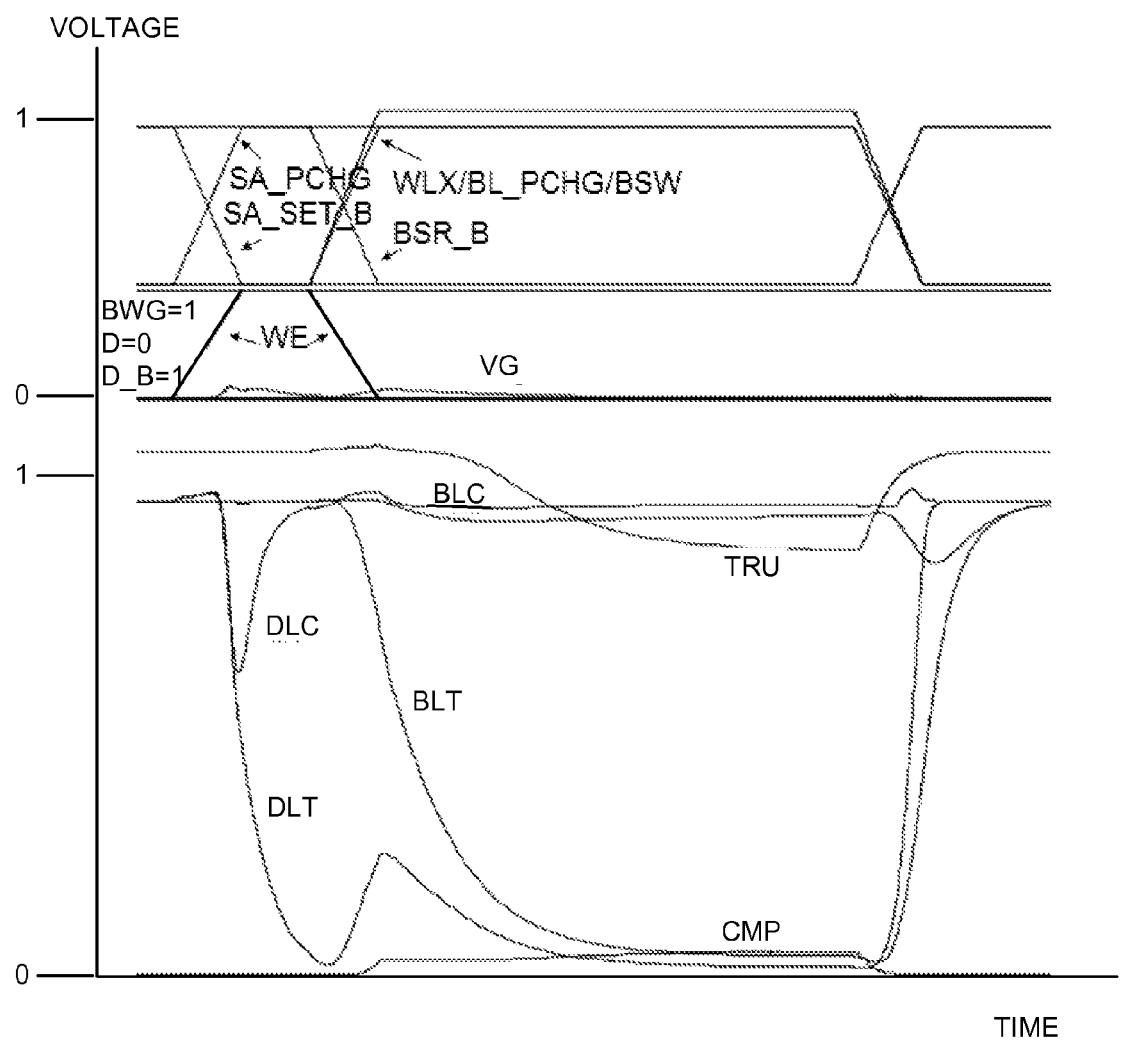
FIGS. 2 and 3 are respective waveforms illustrating example operations of the circuit of FIG. 1 with skewed cell and BOOST disabled, where Sensing (Sense Amp) Local Write Driver circuit WRITE 0 operation fails; and with skewed cell and BOOST enabled, where Sensing (Sense Amp) Local Write Driver circuit WRITE 0 operation succeeds in accordance with a preferred embodiment.
Figure 3:
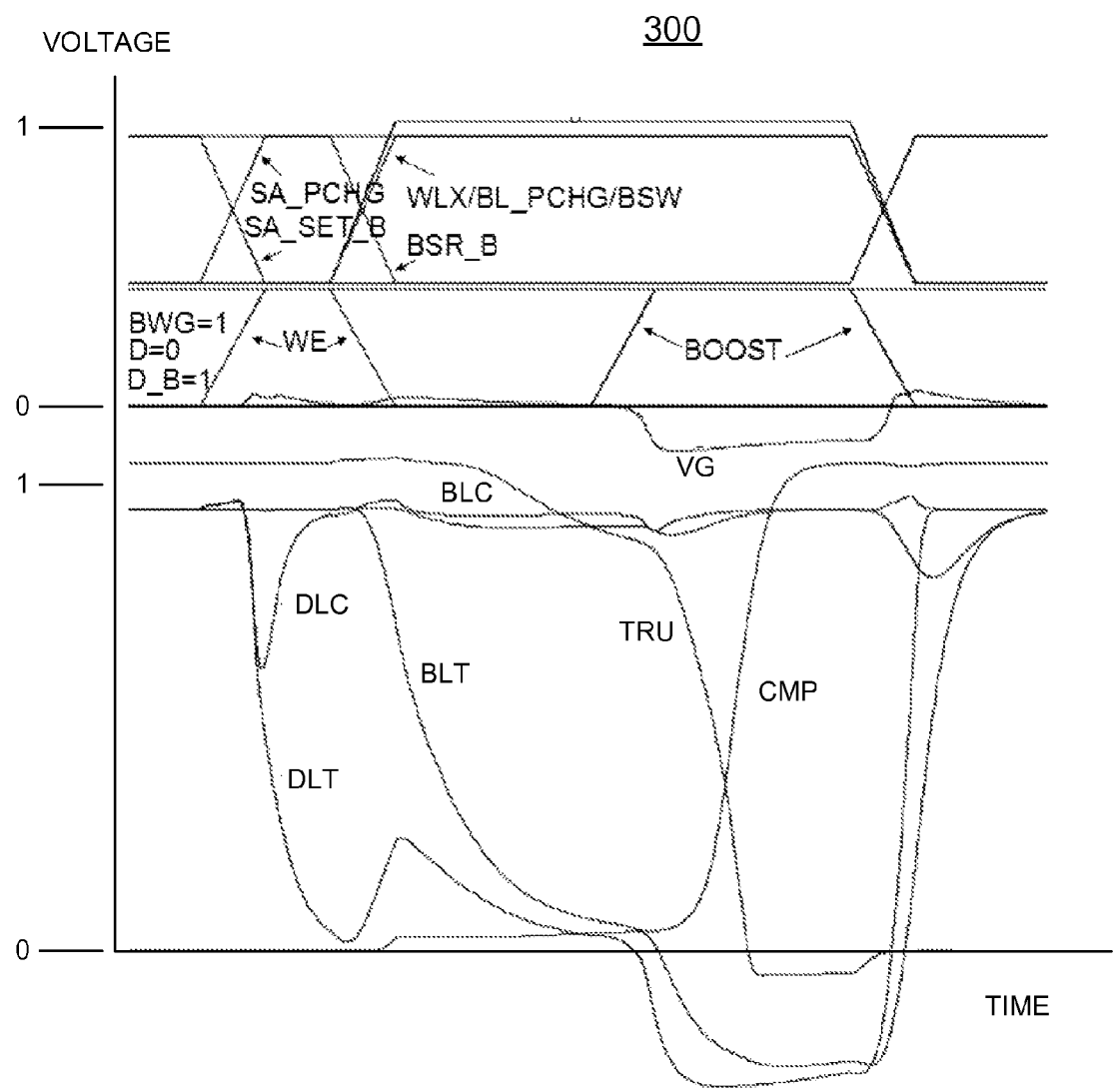

A pair of NFET 166 receiving a write enable WE gate input are pass-gate devices connected between a respective internal node DLT, DLC of the sense amplifier 104 and the respective limited-swing driver 106. The write enable WE gate input which is driven high for a write operation, as shown in FIGS. 2 and 3. Each limited-swing driver 106 includes a series connected NFET 172 and PFET 174 connected between the supply rail VDD and source rail. NFET 172 is connected to the supply rail and PFET 174 is drain connected to the source rail. This limits the swing of the global data node to the difference between the supply voltage VDD minus one NFET device Vt drop and the source voltage plus one PFET device Vt drop. A respective gate input of respective signals D, D_B is applied to each limited-swing driver 106 which provide a respective WDLC, WDLT signal to respective pass-gate NFET 166.

The write assist boost circuit 108 of the preferred embodiment overcomes a skewed SRAM cell significantly improving SRAM cell write ability. The write assist boost circuit 108 includes a two-input NAND 182 receiving an input of BOOST signal and an input of the BWG signal. An output of NAND 182 is applied to a boost capacitor 184. The write assist boost circuit 108 includes a PFET 186 and NFETs 188, 190, 192, as shown. PFET 186 and NFETs 190, 192 are connected in a stack between the voltage rail VDD and node VG to a connection of the boost capacitor 184 and NFET 188. A connection of PFET 186 and NFET 190 at node NDIS provides a gate input to NFET 188. The BOOST signal is applied to the gate input of PFET 186 and NFETs 188, 190.

Referring also to FIGS. 2 and 3, there are shown respective waveforms generally designated by the reference characters 200, 300 illustrating example circuit operations with skewed cell and BOOST disabled in FIG. 2, where Sensing (Sense Amp) Local Write Driver circuit WRITE 0 operation fails and with skewed cell and BOOST enabled in FIG. 3, Sensing (Sense Amp) Local Write Driver circuit WRITE 0 operation succeeds in accordance with a preferred embodiment.

For example, consider a Write Operation with Bit Write On (BWG=1) as follows:
Referencing the signal names used with SRAM circuit 100 in FIG. 1, a write operation cycle begins with WLX/WL0/BL_PCHG/BSW/SA_PCHG/WE/BOOST held low (source) and BSR_B/SA_SET_B held high (supply). Thus internal node pairs BLT, BLC and DLT, DLC are in a precharge state, or held high. Internal node VG is held low through NFET 188.

When a write operation begins:
First, SA_PCHG is driven high (to supply), turning off precharge and equalization PFET devices 146, 148, 150, and SA_SET_B is driven low (to source), turning on NFET device 156. This releases the node pair DLT, DLC to a weak high state and sets the sense amplifier 104 connecting the internal nodes to ground (low) through NFET 156.

Concurrently WE is driven high, opening pass-gate NFETs 166, and, because the sense amplifier 104 is connected low through NFET 156, internal node pair DLT, DLC resolve, through cross-coupled NFETs 152, 154 and PFETs 142, 144, to the desired data state. In FIGS. 2 and 3, data input D is held low for a WRITE 0 operation thus DLT resolves low and DLC resolves high. After a desired delay in which the sense amplifier 104 resolves to the data state, WE is driven low thus isolating the node pair DLT, DLC from the high capacitance global data nets, WDLT, WDLC.

Next, signal BL_PCHG is driven high turning off precharge and equalization PFET 122, 124, 126 which releases internal node pair BLT, BLC to a weak high state. Concurrently, signal BSR_B is driven low and signal BSW is driven high making a full pass-gate connection between DLT, BLT and DLC, BLC by NFET 128, PFET 130 and NFET 132, PFET 134, respectively. Thus internal node pair BLT, BLC resolve to the same data state as internal node pair DLT, DLC. Also concurrently, a particular wordline input WL0-WLX is driven high opening the NFET pass-gate devices 118, 120 of the targeted SRAM cell 109. As shown in FIG. 2, an attempted write 0 operation with a skewed SRAM cell 109 where the write drive strength is not enough to overcome the skew of the SRAM cell 109, BLT is driven low and BLC is driven high.

To overcome a skewed SRAM cell 109 and improve the write ability of the SRAM design, FIG. 3 shows the operation of the write assist boost circuit 108. After a delay in which the internal node BLT reaches a low state, the BOOST signal is driven high. Internal node NDIS is driven low disabling NFET 188 and disconnecting internal node VG from the global source. Internal node BOOSTN of the write assist boost circuit 108 is driven low through the CMOS NAND 182 and capacitive BOOSTCAP device 184 is discharged coupling with and boosting internal node VG below the low state. The boost then supplies the SRAM cell with an increased differential through NFET 156, NFETs 152, 154, NFETs 128, 132, and NFETs 118, 120 which helps to overcome the skew of the pass-gates on the SRAM cell and complete the write 0 operation.

At the completion of the write operation all input signals return to the beginning state and all internal node pairs DLT, DLC and BLT, BLC return to a precharged, equalized state.

For example, consider a Write Operation with Bit Write Off as follows: For a write operation with bit write off (BWG=0), both D and D_B would be driven low thus forcing WDLT, WDLC high and holding sense amp nodes DLT, DLC high. With BWG=0, BOOSTN would be held low and SET would be held low ensuring that for the unselected bit there could be no path to ground. Both the local bit lines will remain high and no write operation will take place throughout the write cycle.

For example, consider a Read Operation as follows:
During a read operation BOOST and WE are held low, Node NDIS is high, and VG is held low through NFET 188. This enables a standard read operation using standard signal timing and overlap.

Figure 4:
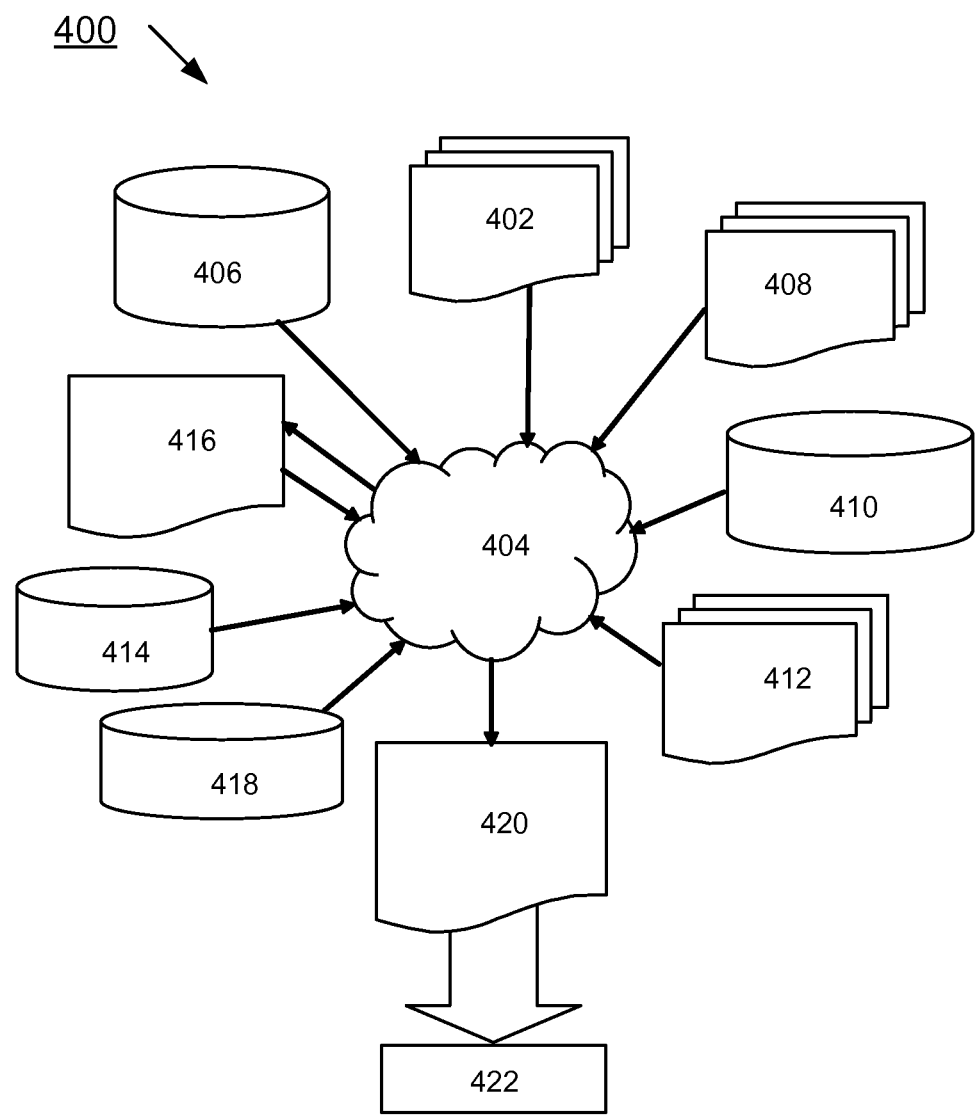
FIG. 4 is a flow diagram of a design process used in semiconductor design, manufacturing, and/or test.

FIG. 4 is a flow diagram of a design process used in semiconductor design, manufacturing, and/or test. FIG. 4 shows a block diagram of an example design flow 400. Design flow 400 may vary depending on the type of IC being designed. For example, a design flow 400 for building an application specific IC (ASIC) may differ from a design flow 400 for designing a standard component. Design structure 402 is preferably an input to a design process 404 and may come from an IP provider, a core developer, or other design company or may be generated by the operator of the design flow, or from other sources. Design structure 402 comprises circuit 100 in the form of schematics or HDL, a hardware-description language, for example, Verilog, VHDL, C, and the like. Design structure 402 may be tangibly contained on one or more machine readable medium. For example, design structure 402 may be a text file or a graphical representation circuit 100. Design process 404 preferably synthesizes, or translates, circuit 100 into a netlist 406, where netlist 406 is, for example, a list of wires, transistors, logic gates, control circuits, I/O, models, etc. that describes the connections to other elements and circuits in an integrated circuit design and recorded on at least one of machine readable medium. This may be an iterative process in which netlist 406 is resynthesized one or more times depending on design specifications and parameters for the circuit.

Design process 404 may include using a variety of inputs; for example, inputs from library elements 404 which may house a set of commonly used elements, circuits, and devices, including models, layouts, and symbolic representations, for a given manufacturing technology, such as different technology nodes, 42 nm, 45 nm, 90 nm, and the like, design specifications 410, characterization data 412, verification data 414, design rules 416, and test data files 418, which may include test patterns and other testing information. Design process 404 may further include, for example, standard circuit design processes such as timing analysis, verification, design rule checking, place and route operations, and the like. One of ordinary skill in the art of integrated circuit design can appreciate the extent of possible electronic design automation tools and applications used in design process 404 without deviating from the scope and spirit of the invention. The design structure of the invention is not limited to any specific design flow.

Design process 404 preferably translates embodiments of the invention as shown in FIG. 1, along with any additional integrated circuit design or data (if applicable), into a second design structure 420. Design structure 420 resides on a storage medium in a data format used for the exchange of layout data of integrated circuits, for example, information stored in a GDSII (GDS2), GL1, OASIS, or any other suitable format for storing such design structures. Design structure 420 may comprise information such as, for example, test data files, design content files, manufacturing data, layout parameters, wires, levels of metal, vias, shapes, data for routing through the manufacturing line, and any other data required by a semiconductor manufacturer to produce an embodiment of the invention as shown in FIG. 1. Design structure 420 may then proceed to a stage 422 where, for example, design structure 420 proceeds to tape-out, is released to manufacturing, is released to a mask house, is sent to another design house, is sent back to the customer, and the like.

While the present invention has been described with reference to the details of the embodiments of the invention shown in the drawing, these details are not intended to limit the scope of the invention as claimed in the appended claims.

What is claimed is:

1. A circuit for implementing sense amplifiers for sensing local write driver with bootstrap write assist for Static Random Access Memory (SRAM) arrays comprising:
   a SRAM cell column including a plurality of SRAM cells;
   a sense amplifier coupled to said SRAM cell column used in both read and write operations; said sense amplifier capturing and amplifying write data and driving the write data onto local bit lines;
   write assist boost circuitry coupled to said sense amplifier temporarily supplying an increased device voltage differential to said SRAM cell during write operations; said write assist boost circuitry including a boost capacitor and said sense amplifier includes a delay stage inverter for boosting a common bit line source node below source voltage during the write operation.

2. The circuit as recited in claim 1 includes a pair of limited swing drivers coupled to said sense amplifier for limiting swing of global data signals.

3. The circuit as recited in claim 2 wherein each of said limited swing drivers include a series connected N-channel field effect transistor (NFET) and P-channel field effect transistor (PFET) between a positive voltage supply rail VDD and a source rail, with said NFET connected to the positive voltage supply rail VDD and said PFET drain connected to the source rail.

4. The circuit as recited in claim 2 wherein said sense amplifier used with said pair of limited swing drivers provides enhanced active and static power saving performance.

5. The circuit as recited in claim 1 wherein said sense amplifier driving the write data onto local bit lines includes said sense amplifier providing full transmission gate data driving for write operations.

6. The circuit as recited in claim 1 wherein said sense amplifier providing full transmission gate data driving for write operations includes both N-channel field effect transistor (NFET) and P-channel field effect transistor (PFET) providing full transmission gate data driving for write operations.

7. The circuit as recited in claim 1 wherein said sense amplifier includes a virtual ground (VG) connection to said boost capacitor of said write assist boost circuitry.

8. A design structure embodied in a non-transitory machine readable medium used in a design process, the design structure comprising:
   a circuit tangibly embodied in the non-transitory machine readable medium used in the design process, said circuit for implementing sense amplifiers for sensing local write driver with bootstrap write assist for Static Random Access Memory (SRAM) arrays, said circuit comprising:
   a SRAM cell column including a plurality of SRAM cells;
   a sense amplifier coupled to said SRAM cell column used in both read and write operations; said sense amplifier capturing and amplifying write data and driving the write data onto local bit lines;
   write assist boost circuitry coupled to said sense amplifier temporarily supplying an increased device voltage differential to said SRAM cell during write operations;
   said sense amplifier includes a virtual ground (VG) connection to a boost capacitor of said write assist boost circuitry, wherein the design structure, when read by a hardware processor and used by said hardware processor in manufacture of a semiconductor chip produces a chip comprising said circuit.

9. The design structure of claim 8, wherein the design structure comprises a netlist, which describes said circuit.

10. The design structure of claim 8, wherein the design structure resides on storage medium as a data format used for exchange of layout data of integrated circuits.

11. The design structure of claim 8, wherein the design structure includes at least one of test data files, characterization data, verification data, or design specifications.

12. The design structure of claim 8, includes a pair of limited swing drivers coupled to said sense amplifier for limiting swing of global data signals.

13. The design structure of claim 12, wherein said sense amplifier used with said pair of limited swing drivers provides enhanced active and static power saving performance.

14. A method for implementing sense amplifiers for sensing local write driver with bootstrap write assist for Static Random Access Memory (SRAM) arrays comprising:
   providing a SRAM cell column including a plurality of SRAM cells;
   providing a sense amplifier coupled to said SRAM cell column used in both read and write operations; using said sense amplifier capturing and amplifying write data and driving the write data onto local bit lines;
   providing write assist boost circuitry coupled to said sense amplifier temporarily supplying an increased device voltage differential to said SRAM cell during write operations includes providing said sense amplifier with a virtual ground (VG) connection to a boost capacitor of said write assist boost circuitry.

15. The method as recited in claim 14 includes providing a pair of limited swing drivers coupled to said sense amplifier for limiting swing of global data signals.

16. The method as recited in claim 15 wherein providing said pair of limited swing drivers coupled to said sense amplifier includes providing each of said limited swing drivers with a series connected N-channel field effect transistor (NFET) and P-channel field effect transistor (PFET) connected between a positive voltage supply rail VDD and a source rail, with said NFET connected to the positive voltage supply rail VDD and said PFET drain connected to the source rail.

17. The method as recited in claim 14 wherein said sense amplifier driving the write data onto local bit lines includes said sense amplifier providing full transmission gate data driving for write operations.

18. The method as recited in claim 17 wherein said sense amplifier providing full transmission gate data driving for write operations includes said sense amplifier providing both N-channel field effect transistor (NFET) and P-channel field effect transistor (PFET) providing full transmission gate data driving for write operations.

\* \* \* \* \*